United States Patent
Kim et al.

(10) Patent No.: US 8,035,431 B2
(45) Date of Patent: Oct. 11, 2011

(54) DELAY LOCKED LOOP AND DELAY LOCKING METHOD HAVING BURST TRACKING SCHEME

(75) Inventors: Yong-Ju Kim, Gyeonggi-do (KR);
Sung-Woo Han, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR);
Hae-Rang Choi, Gyeonggi-do (KR);
Ji-Wang Lee, Gyeonggi-do (KR);
Jae-Min Jang, Gyeonggi-do (KR);
Chang-Kun Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 137 days.

(21) Appl. No.: 12/494,509

(22) Filed: Jun. 30, 2009

(65) Prior Publication Data
US 2010/0301912 A1   Dec. 2, 2010

(30) Foreign Application Priority Data
Jun. 2, 2009  (KR) .................. 10-2009-0048587

(51) Int. Cl.
*H03L 7/06*   (2006.01)
(52) U.S. Cl. ........................ 327/158; 327/149
(58) Field of Classification Search ............ 327/149, 327/158
See application file for complete search history.

(56) References Cited

U.S. PATENT DOCUMENTS

| | | | | |
|---|---|---|---|---|
| 7,079,616 | B2 * | 7/2006 | Castiglione et al. | 375/376 |
| 7,111,185 | B2 * | 9/2006 | Gomm et al. | 713/401 |
| 7,173,462 | B1 * | 2/2007 | Wang | 327/158 |
| 2007/0182469 | A1 * | 8/2007 | Zimlich | 327/158 |
| 2010/0277211 | A1 * | 11/2010 | Geng et al. | 327/158 |
| 2010/0289541 | A1 * | 11/2010 | Wu | 327/158 |
| 2010/0301912 | A1 * | 12/2010 | Kim et al. | 327/158 |

FOREIGN PATENT DOCUMENTS
JP   09-321658   12/1997

OTHER PUBLICATIONS

Notice of Allowance issued from Korean Intellectual Property Office on Feb. 7, 2011.

* cited by examiner

*Primary Examiner* — Lincoln Donovan
*Assistant Examiner* — Adam Houston
(74) *Attorney, Agent, or Firm* — IP & T Group LLP (57) ABSTRACT

A Delay Locked Loop (DLL) includes a replica delay unit configured to delay an output clock to generate a feedback clock; a phase detector configured to measure a phase difference between the feedback clock and an input clock; a quantization unit configured to quantize the phase difference measured by the phase detector; and a delay unit configured to delay the input clock based on a quantization result from the quantization unit to generate the output clock.

12 Claims, 10 Drawing Sheets

DELAY LOCKED LOOP AND DELAY LOCKING METHOD HAVING BURST TRACKING SCHEME

CROSS-REFERENCE TO RELATED APPLICATIONS

The present application claims priority of Korean patent application number 10-2009-0048587, filed on Jun. 2, 2009, the disclosure of which is incorporated by reference in its entirety.

BACKGROUND OF THE INVENTION

The present invention relates to a Delay Locked Loop (DLL) for use in various systems which operate based on clocks, and more particularly, to a technology which enables DLL to operate at quick speed by employing a burst scheme.

Conventionally, a clock is used as a reference for regulating operation timing in systems or circuits, and is also used to ensure faster operation without an error. When a clock is provided from outside and used within a system or circuit, a time delay (also called "skew") occurs due to internal circuits. To compensate such a time delay and make it sure that a phase of an internal clock is consistent with that of an external clock, DLL may be used.

Meanwhile, the DLL is less influenced by noises compared with a Phase Locked Loop (PLL) that is previously used and thus has been widely used in the field of synchronous semiconductor memories, including Synchronous Dynamic Random Access Memory (SDRAM) and Double Data Rate SDRAM (DDR SDRAM).

Figure 1:
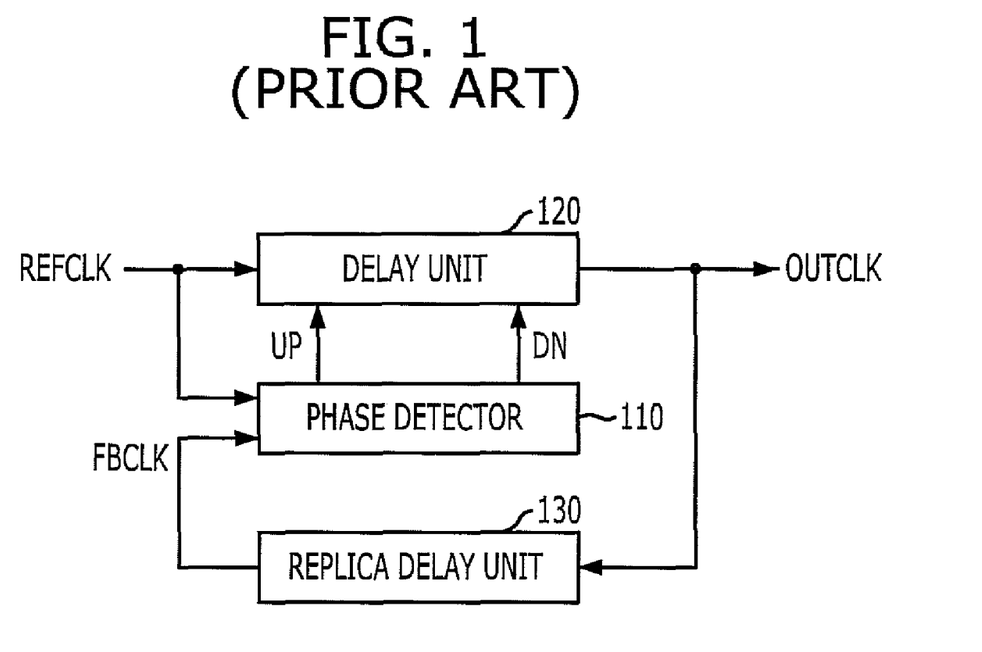
FIG. 1 is a block diagram showing a configuration of a conventional DLL.

FIG. 1 is a block diagram showing a configuration of a conventional DLL.

Referring to FIG. 1, the conventional DLL includes a phase detector 110, a delay unit 120, and a replica delay unit 130.

The replica delay unit 130 delays an output clock OUTCLK of the DLL to generate a feedback clock FBCLK. This replica delay unit 130 has a delay amount that is derived by modeling delay elements through which the output clock OUTCLK is generated from the DLL and sent to a chip or system.

The phase detector 110 compares a phase of the input clock REFCLK (in general, a clock inputted from the outside of a chip (or system) to the DLL with that of the feedback clock FBCLK to output an up signal UP or down signal DN. If a phase of the input clock REFCLK precedes that of the feedback signal FBCLK, the phase detector 110 activates and outputs a down signal DN; and if a phase of the feedback signal FBCLK precedes that of the input clock REFCLK, it activates and outputs an up signal UP.

The delay unit 120 delays the input clock REFCLK to generate an output clock OUTCLK. A delay amount of the delay unit 120 is determined based on the up signal UP and the down signal DN, and increases whenever the up signal UP is activated and decreases whenever the down signal DN is activated.

Through this operation, the DLL generates its output clock OUTCLK to make sure that a rising edge of the feedback clock FBCLK can be consistent with that of the input clock REFCLk.

Figure 2:
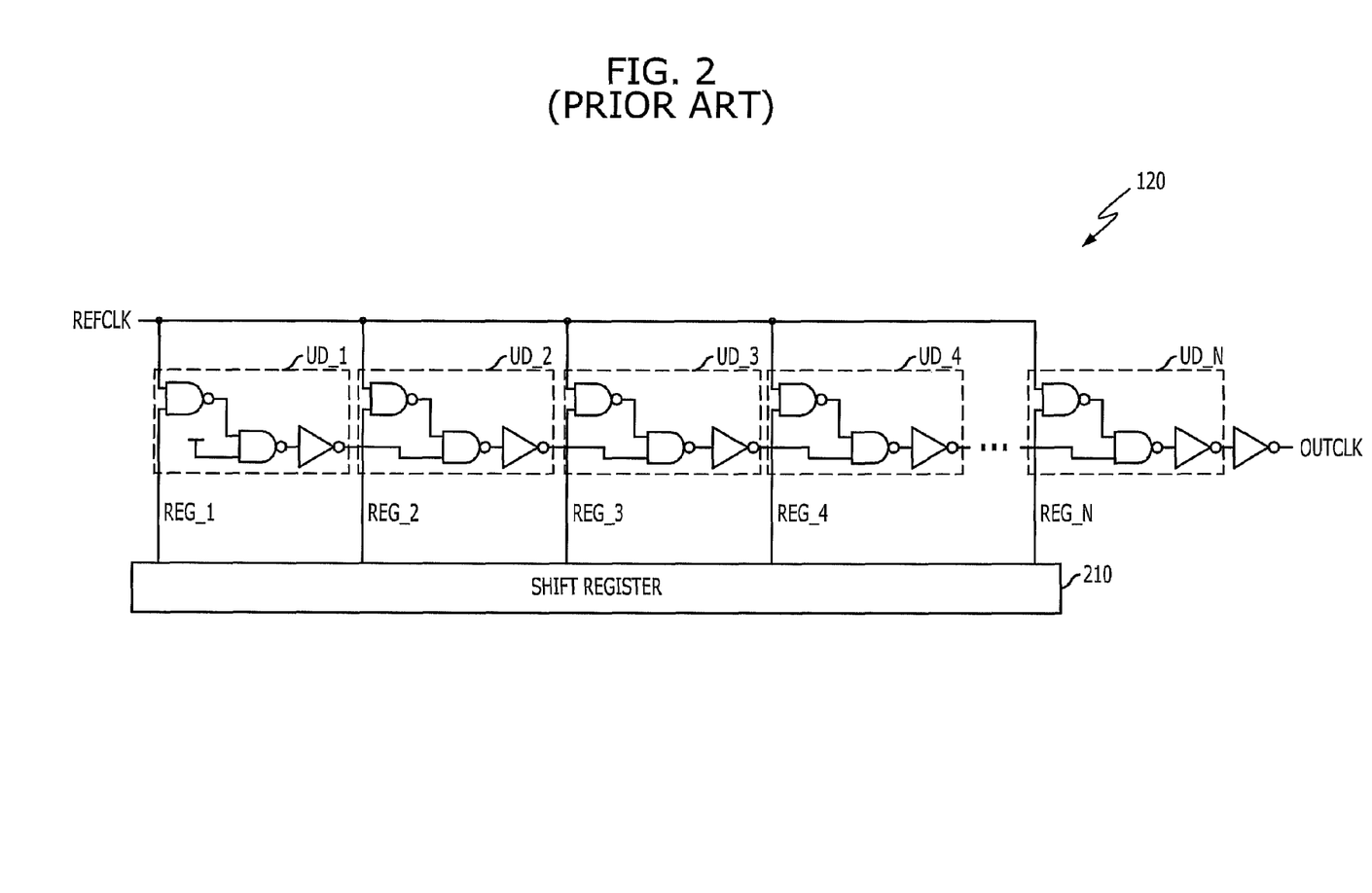
FIG. 2 shows a detailed circuit diagram of the delay unit of FIG. 1.

FIG. 2 shows a detailed circuit diagram of the delay unit 120 of FIG. 1.

As shown therein, the delay unit 120 is composed of a plurality of unit delay stages UD_1 to UD_N and a shift register 210.

The unit delay stages UD_1 to UD_N are used for delaying an input clock REFCLK to generate an output clock OUTCLK, in which the number of unit delay stages used is determined depending on output signals REG_1 to REG_N to be provided by the shift register 210. The input clock REFCLK is delayed through one of the unit delay stages UD_1 to UD_N that receives an activated one of the output signals REG_1 to REG_N and through the subsequent delay stages. For example, when the REG_3 is activated, the input clock REFCLK is delayed by the unit delay stages UD_3 to UD_N; and when the REG_4 is activated, the input clock REFCLK is delayed by the unit delay stages UD_4 to UD_N.

The shift register 210 activates one of its output signals REG_1 to REG_N in response to the up signal UP and the down signal DN. Whenever the up signal UP is activated, the shift register 210 activates the immediately adjacent one of the output signals REG_1 to REG_N on the left side of the currently activated output signal, and whenever the down signal DN is activated, the shift register 210 activates the immediately adjacent one of the output signals REG_1 to REG_N on the right side one of the currently activated output signal, wherein the order of the output signals from left to right matches the order of the unit delay stages from left to right in series. For example, in a state where REG_3 is activated, when the up signal UP is activated once, REG_2 is activated; and in a state where REG_3 is activated, when the down signal DN is activated once, REG_4 is activated. Therefore, whenever the up signal UP is activated, a delay amount of the delay unit 120 increases by one unit delay of the unit delay stages UD_1 to UD_N; and whenever the up signal UP is activated, a delay amount of the delay unit 120 decreases by one unit delay of the unit delay stages UD_1 to UD_N.

The DLL operates in a certain periodic cycle. This is because the DLL performs the process as follows: a relative phase between the input clock REFCLK and the feedback clock FBCLK is detected by the phase detector 110, the result is provided as a feedback to the delay unit 120 to be reflected thereat, and the output clock OUTCLK of the delay unit 120 is delayed by the replica delay unit 130. According to the conventional DLL, however, a delay value is varied by a unit delay amount per each cycle (that is, a delay value per each cycle is varied only by one unit delay step). Thus, this method makes a locking time (which is time taken until a rising edge of the feedback clock FBCLK becomes consistent with that of the input clock REFCLK) of DLL considerably longer. Even after locking, time taken to again correct a phase of clock (REFCLK, FBCLK, or OUTCLK), if any of them varies, may be prolonged. Since these factors are directly related to the performance of DLL, there is a need for a technology that allows the DLL to relatively rapidly operate.

SUMMARY OF THE INVENTION

Embodiments of the present invention are directed to providing a technology which is capable of reducing locking time of DLL by increasing the speed thereof, and relatively rapidly correcting jitter components of clock that occur after locking of DLL.

In accordance with an embodiment of the present invention, there is provided a Delay Locked Loop (DLL) including a replica delay unit configured to delay an output clock to generate a feedback clock; a phase detector configured to measure a phase difference between the feedback clock and an input clock; a quantization unit configured to quantize the phase difference measured by the phase detector; and a delay unit configured to delay the input clock based on a quantization result from the quantization unit to generate the output clock.

The quantization unit may quantize the phase difference measured by the phase detector in units of a unit delay amount, and the delay unit may vary a delay value of the input clock by a number of the unit delay amount corresponding to the quantization result from the quantization unit.

The phase detector may output an up signal for an interval where a phase of the input clock precedes a phase of the feedback clock, or a down signal for an interval where a phase of the feedback clock precedes a phase of the input clock.

The quantization unit may include an up-code generator configured to quantize the up signal to generate an up-code indicating a value of a quantized up signal; a down-code generator configured to quantize the down signal to generate a down-code indicating a value of a quantized down signal; a right adjustor configured to activate a right signal to decrease a delay value of the delay unit for the number of times corresponding to the down-code; and a left adjustor configured to activate a left signal to increase a delay value of the delay unit for the number of times corresponding to the up-code.

The quantization unit may further include a filter configured to filter the up-code generated by the up-code generator and the down-code generated by the down-code generator to transfer filtered codes to the right adjustor and the left adjustor, respectively.

The delay unit may include a plurality of unit delay stages configured to delay the input clock; and a shift register configured to adjust the number of the unit delay stages used to delay the input clock in response to the right signal and the left signal.

The up-code generator may include a plurality of unit delay lines of feedback clock configured to sequentially delay the feedback clock by a unit delay amount; and a plurality of D flip-flops configured to receive output clocks of the unit delay lines of feedback clock via clock terminals and the up signal via D terminals to generate the up-code.

The down-code generator may include a plurality of unit delay lines of input clock configured to sequentially delay the input clock by a unit delay amount; and a plurality of D flip-flops configured to receive output clocks of the unit delay lines of input clock via clock terminals and the down signal via D terminals to generate the down-code.

The left adjustor may include a left activation signal generator configured to generate a left activation signal that is activated during a clock cycle corresponding to the up-code; and a left signal generator configured to activate the left signal during the activation of the left activation signal and the clock.

The right adjustor may include a right activation signal generator configured to generate a right activation signal that is activated during a clock cycle corresponding to the down-code; and a right signal generator configured to activate the right signal during the activation of the right activation signal and the clock.

In accordance with another embodiment of the present invention, there is provided a delay locking method including: delaying an output clock to generate a feedback clock; measuring a phase difference between the feedback clock and an input clock; determining the phase difference measured by the phase detector in units of a unit delay amount; and delaying the input clock based on a quantization result to generate the output clock.

In the delaying, a delay value may be varied by a number of the unit delay value corresponding to the quantization result.

The measuring may generate an up signal for an interval where a phase of the input clock precedes a phase of the feedback clock, or a down signal for an interval where a phase of the feedback clock precedes a phase of the input clock.

The determining of the phase difference may include determining the up signal to generate an up-code indicating a value of a quantized up signal; determining the down signal to generate a down-code indicating a value of a quantized down signal; activating a right signal to decrease a delay value in said delaying for the number of times corresponding to the down-code; and activating a left signal to increase a delay value in said delaying for the number of times corresponding to the up-code.

DESCRIPTION OF SPECIFIC EMBODIMENTS

Hereinafter, the most preferred embodiment of the present invention will be described in detail with reference to the accompanying drawings so that the invention can be easily practiced by those skilled in the art to which the invention pertains.

Figure 3:
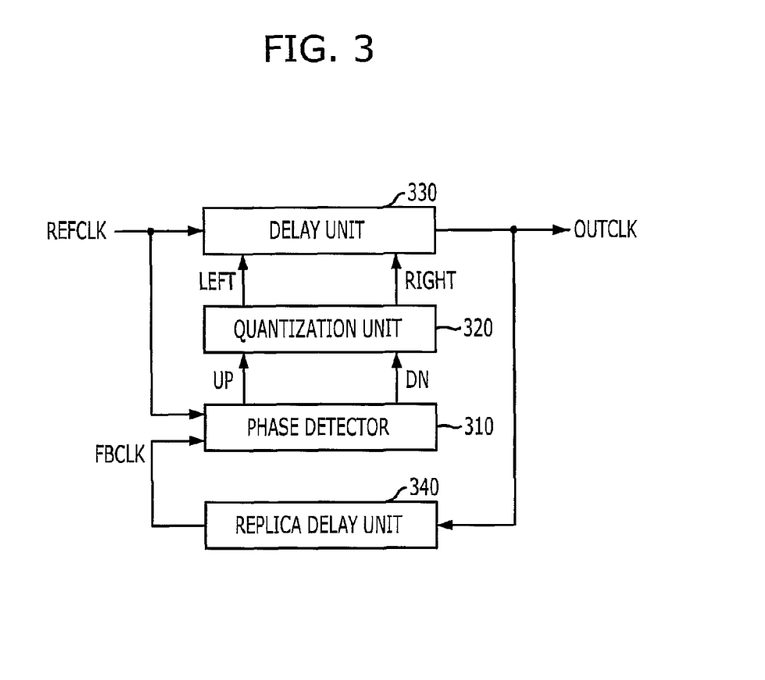
FIG. 3 illustrates a block diagram showing a configuration of a DLL in accordance with an embodiment of the present invention.

FIG. 3 illustrates a block diagram illustrating a configuration of a DLL in accordance with an embodiment of the present invention.

Referring to FIG. 3, the DLL in accordance with the present invention includes a replica delay unit 340 for delaying an output clock OUTCLK to output a feedback clock FBCLK, a phase detector 310 for measuring a phase difference between the feedback clock FBCLK and an input clock REFCLK, a quantization unit 320 for quantizing result UP or DOWN corresponding to the phase difference measured by the phase detector 310 to output RIGHT or LEFT, and a delay unit 330 for delaying the input clock REFCLK depending on quantization result RIGHT or LEFT from the quantization unit 320 to generate the output clock OUTCLK.

The phase detector 310 measures a phase difference between the feedback clock FBCLK and the input clock REFCLK. To be more specific, the phase detector 310 outputs an up signal UP for an interval where a phase of the input clock REFCLK precedes that of the feedback clock FBCLK, or a down signal DN for an interval where a phase of the feedback clock FBCLK precedes that of the input clock REF- CLK. The activation of the up signal UP means that a phase of the input clock REFCLK precedes that of the feedback clock FBCLK, and a pulse width of the up signal UP corresponds to a phase difference between the input clock REFCLK and the feedback clock FBCLK. Also, the activation of the down signal DN means that a phase of the feedback clock FBCLK precedes that of the input clock REFCLK, and a pulse width of the down signal DN corresponds to a phase difference between the feedback clock FBCLK and the input clock REFCLK.

The quantization unit 320 quantizes the measurement result UP or DN provided by the phase detector 310. When the up signal UP is activated, the quantization unit 320 quantizes a pulse width of the up signal UP in unit of delay amount of a unit delay stage to activate the right signal RIGHT for the number of times corresponding to the quantization result. For example, if the up signal UP has a pulse width corresponding to unit delay amount of DLL×3, the quantization unit 320 activates the right signal RIGHT for three times. Also, when the down signal DN is activated, the quantization unit 320 quantizes a pulse width of the down signal DN in units of delay amount of a unit delay stage to activate the left signal LEFT for the number of times corresponding to the quantization result. Details of the quantization unit 320 will be given later with reference to the accompanying drawings.

The delay unit 330 delays the input clock REFCLK based on the quantization result from the quantization unit 320 to generate the output clock OUTCLK. Whenever the right signal RIGHT is activated, the delay unit 330 decreases its delay value by a delay amount of a unit delay stage; and whenever the left signal LEFT is activated, the delay unit 330 increases its delay value by a delay amount of a unit delay stage. This delay unit 330 can be configured to be, for example, equal to the existing delay unit (see FIG. 2) other than, for example, the configuration where the up signal UP and the down signal DN applied to the delay unit in FIG. 2 are replaced by the left signal LEFT and the right signal RIGHT, respectively.

The DLL of the present invention checks as to whether a phase of one of the input clock REFCLK and the feedback clock FBCLK precedes that of the other, and measures an amount of a phase difference between the two clocks REFCLK and FBCLK. Then, the DLL changes the delay amount of the delay unit 330 by an amount corresponding to the results. For example, if it is measured that the input clock REFCLK precedes the feedback signal FBCLK by a 3-unit delay amount, the DLL decreases the delay amount of the delay unit 330 by a 3-unit delay amount; and if it is measured that the input clock REFCLK precedes the feedback clock FBCLK by a 2-unit delay amount, the DLL decreases the delay amount of the delay unit 330 by a 2-unit delay amount. That is, the DLL of the present invention does not vary the delay amount of the delay unit 330 by a 1-unit delay amount per one cycle operation, but varies it by a delay amount (1 to N) corresponding to a phase difference measured. Thus, the DLL of the present invention can operate at a faster speed than the existing DLL.

Figure 4:
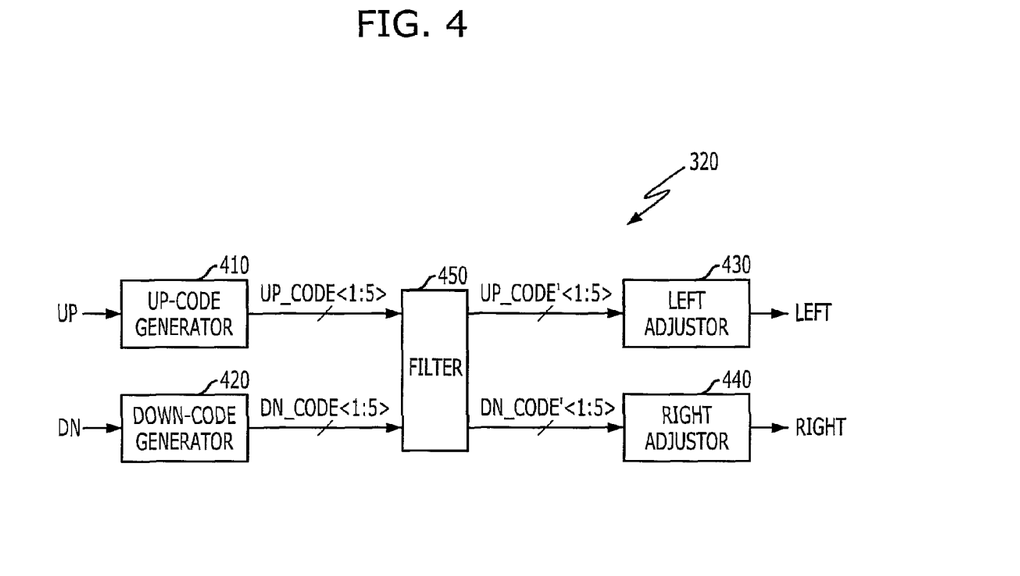
FIG. 4 illustrates a detailed block diagram of the quantization unit shown in FIG. 3.

FIG. 4 illustrates a detailed block diagram of the quantization unit shown in FIG. 3.

As illustrated therein, the quantization unit 320 includes an up-code generator 410 for determining an up signal UP to generate an up-code UP_CODE<1:5> indicating its value, a down-code generator 420 for determining a down signal DN to generate a down-code DN_CODE<1:5> indicating its value, a right adjustor 440 for activating a right signal RIGHT to decrease a delay value of the delay unit 330 for the number of times corresponding to a down-code DN_CODE'<1:5>, and a left generator 430 for activating a left signal LEFT to increase a delay value of the delay unit 330 for the number of times corresponding to the up-code UP_CODE<1:5>. It can further include a filter 450 for filtering the up-code UP_CODE<1:5> generated by the up-code generator 410 and the down-code DN_CODE<1:5> generated by the down-code generator 420 to deliver filtered codes to the left adjustor 430 and the right adjustor 440, respectively.

More specifically, the up-code generator 410 quantizes a pulse width of the up signal UP in units of a unit delay amount, to generate the up-code UP_CODE<1:5> indicating a quantization result. If a pulse width of the up signal UP is 0 (including deactivation of the up signal), a value of the up-code UP_CODE<1:5> becomes (0,0,0,0,0). If a pulse width of the up signal UP is 1, a value of the up-code UP_CODE<1:5> becomes (1,0,0,0,0), and if a pulse width of the up signal UP is 2, a value of the up-code UP_CODE<1:5> becomes (1,1,0,0,0). That is, the total number of '1' in the up-code UP_CODE<1:5> indicates a pulse width of the up signal UP. Therefore, if the up signal UP has a pulse width of 5, the up-code UP_CODE<1:5> becomes (1,1,1,1,1).

The down-code generator 420 quantizes a pulse width of the down signal DN in units of a unit delay amount, to generate the down-code DN_CODE<1:5> indicating a quantization result. The total number of '1' in the down-code DN_CODE<1:5> indicates a pulse width of the down signal DN. Thus, if a pulse width of the down signal DN is 0 (including deactivation of the down signal), the down-code DN_CODE<1:5> becomes (0,0,0,0,0), and if a pulse width of the down signal DN is 5, the down-code DN_CODE<1:5> becomes (1,1,1,1,1).

The filter 450 filters the up-code UP_CODE<1:5> and the down-code DN_CODE<1:5> to transfer filtered codes to the left adjustor 430 and the right adjustor 440, respectively. The filter 450 serves as a low pass filter that prevents the up-code UP_CODE<1:5> and the down-code DN_CODE<1:5> from abruptly varying. During the operation of the left adjustor 430 and the right adjustor 440, if the up-code UP_CODE<1:5> and the down-code DN_CODE<1:5> are varied, the operation of the left adjustor 430 and the right adjustor 440 may be unstable. The filter 450 prevents the above situation, so that the DLL can stably operate. That is, the filter 460 permits its outputs, the up-code UP_CODE'<1:5> and the down-code DN_CODE'<1:5>, to have a same value during a certain time period. In the drawing, an apostrophe is used for distinguishing the inputs UP_CODE<1:5> and DN_CODE<1:5> to and the outputs UP_CODE'<1:5> and DN_CODE'<1:5> from the filter 450.

The left adjustor 430 activates the left signal LEFT to increase a delay value of the delay unit 330 for the number of times corresponding to the up-code UP_CODE'<1:5>. That is, it consecutively activates the left signal LEFT for the number of times corresponding to a pulse width of the up signal UP, which is indicated by the up-code UP_CODE'<1:5>. Therefore, the left signal LEFT is activated zero to five times, depending on the code value of the up-code UP_CODE'<1:5>. As mentioned above, whenever the left signal LEFT is activated once, a delay value of the delay unit 330 is increased by a unit delay amount.

The right adjustor 440 activates the right signal RIGHT to decrease the delay value of the delay unit 330 for the number of times corresponding to the down-code DN_CODE'<1:5>. That is, it consecutively activates the right signal RIGHT for the number of times corresponding to a pulse width of the down signal DN, which is indicated by the down-code DN_CODE'<1:5>. Therefore, the right signal RIGHT is activated zero to five times, depending on the code value of the down-code DN_CODE'<1:5>. As explained above, whenever the right signal RIGHT is activated once, a delay value of the delay unit 330 is decreased by a unit delay amount.

Figure 5A:
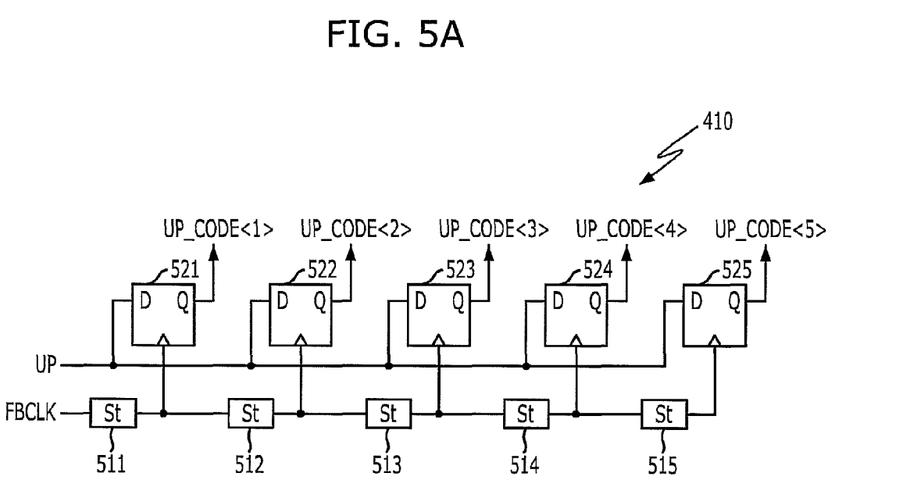
FIG. 5A illustrates a detailed circuit diagram of the up-code generator shown in FIG. 4.
Figure 5B:
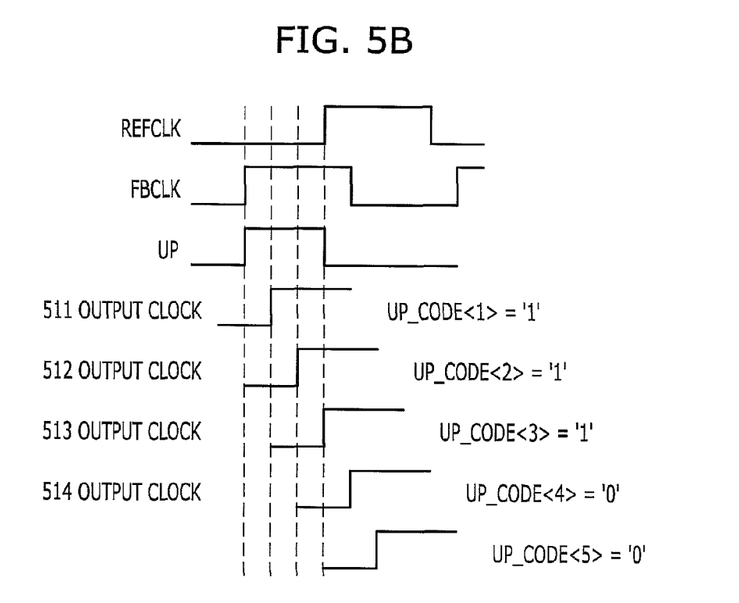
FIG. 5B is a timing diagram for explaining the operation thereof.

FIG. 5A illustrates a detailed circuit diagram of the up-code generator shown in FIG. 4, and FIG. 5B is a timing diagram for explaining the operation thereof.

As shown in FIG. 5A, the up-code generator 410 is composed of a plurality of unit delay lines of feedback clock 511 to 515 for sequentially delaying a feedback clock FBCLK by a unit delay amount, and a plurality of D flip-flops 521 to 525 for receiving output clocks from the unit delay lines of feedback clock 511 to 515 via their clock terminals and an up signal UP via their D terminals to output an up-code UP_CODE<1:5>.

With reference to FIG. 5B, the operation of the up signal generator 410 will now be described in detail. A rising edge of the up signal UP is to be consistent with a rising edge of the feedback clock FBCLK, and the D flip-flops 521 to 525 are to output logic values of the up signal UP at the rising edges of the clocks (from the delay lines 511 to 515) applied to their clock terminals, respectively. Therefore, as the pulse width of the up signal UP gets wider, a larger number of output bits UP_CODE<1:5> of the D flip-flops 521 to 525 have '1', while as the pulse width of the up signal UP gets narrower, a smaller number of output bits UP_CODE<1:5> of the D flip-flops 521 to 525 have '1'.

In FIG. 5B, it is illustrated that the up signal UP has a pulse width equal to 3-unit delay amount. In this case, the up signal UP maintains a level of '1' only until an occurrence of the rising edge of the output clock from the unit delay line 513. Thus, the output UP_CODE<1:3> of the D flip-flops 521 to 523 has a value of '1', while the output UP_CODE<4:5> of the D flip-flops 524 to 525 has a value of '0'.

Figure 6A:
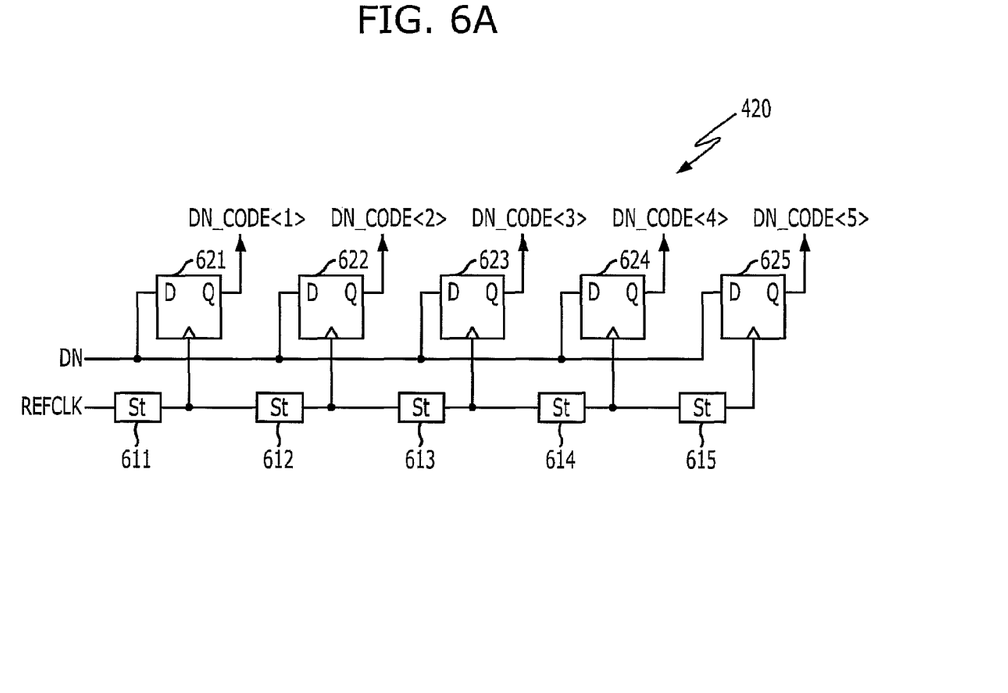
FIG. 6A shows a detailed circuit diagram of the down-code generator shown in FIG. 4.
Figure 6B:
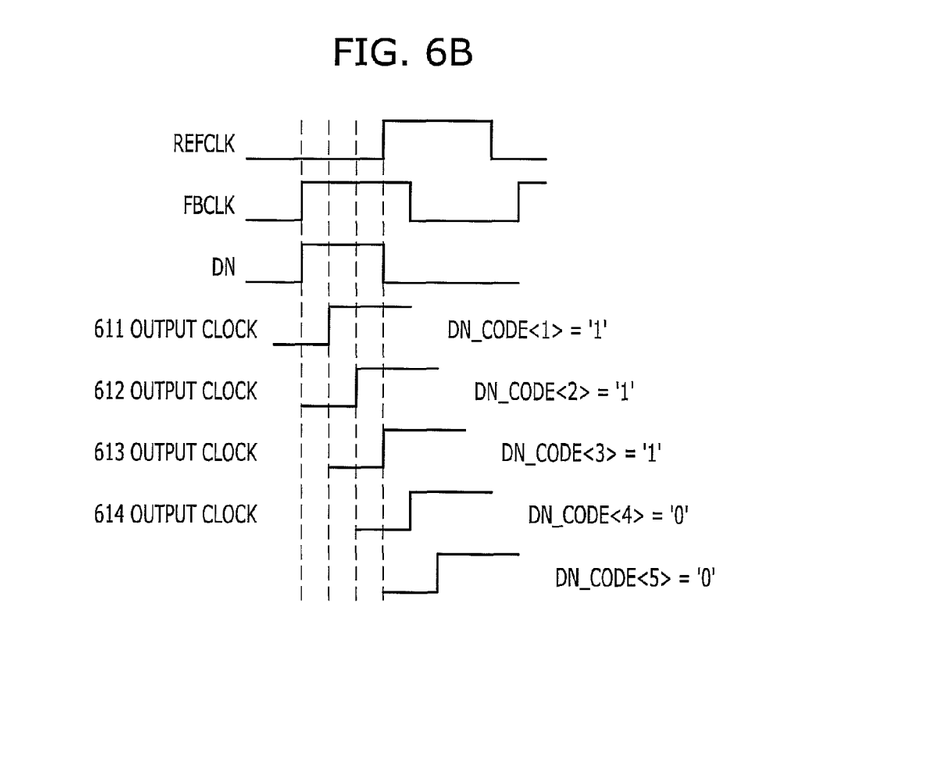
FIG. 6B is a timing diagram for explaining the operation thereof.

FIG. 6A shows a detailed circuit diagram of the down-code generator shown in FIG. 4, and FIG. 6B is a timing diagram for explaining the operation thereof.

Referring to FIG. 6A, the down-code generator 420 is composed of a plurality of unit delay lines of input clock 611 to 615 for sequentially delaying an input clock REFCLK by a unit delay amount, and a plurality of D flip-flops 621 to 625 for receiving output clocks from the unit delay lines of feedback clock 611 to 615 via their clock terminals and a down signal DN via their D terminals to output a down-code DN_CODE<1:5>.

With reference to FIG. 6B, the operation of the down signal generator 420 will now be described in detail. A rising edge of the down signal DN is to be consistent with a rising edge of the input clock REFCLK, and the D flip-flops 621 to 625 is to output logic values of the down signal DN at the rising edges of the clocks (from the delay lines 611 to 615) inputted to their clock terminals, respectively. Therefore, as the pulse width of the down signal DN gets wider, a greater number of output bits DN_CODE<1:5> of the D flip-flops 621 to 625 are to have '1', while as the pulse width of the down signal DN gets narrower, a smaller number of output bits DN_CODE<1:5> of the D flip-flops 621 to 625 are to have '1'.

In FIG. 6B, it is illustrated that the down signal DN has a pulse width equal to 3-unit delay amount. In this case, the down signal DN maintains a level of '1' only until an occurrence of the rising edge of the output clock from the unit delay line 613. Thus, the outputs DN_CODE<1:3> of the D flip-flops 621 to 623 have a value of '1', while the outputs DN_CODE<4:5> of the D flip-flops 624 to 625 have a value of '0'.

Figure 7A:
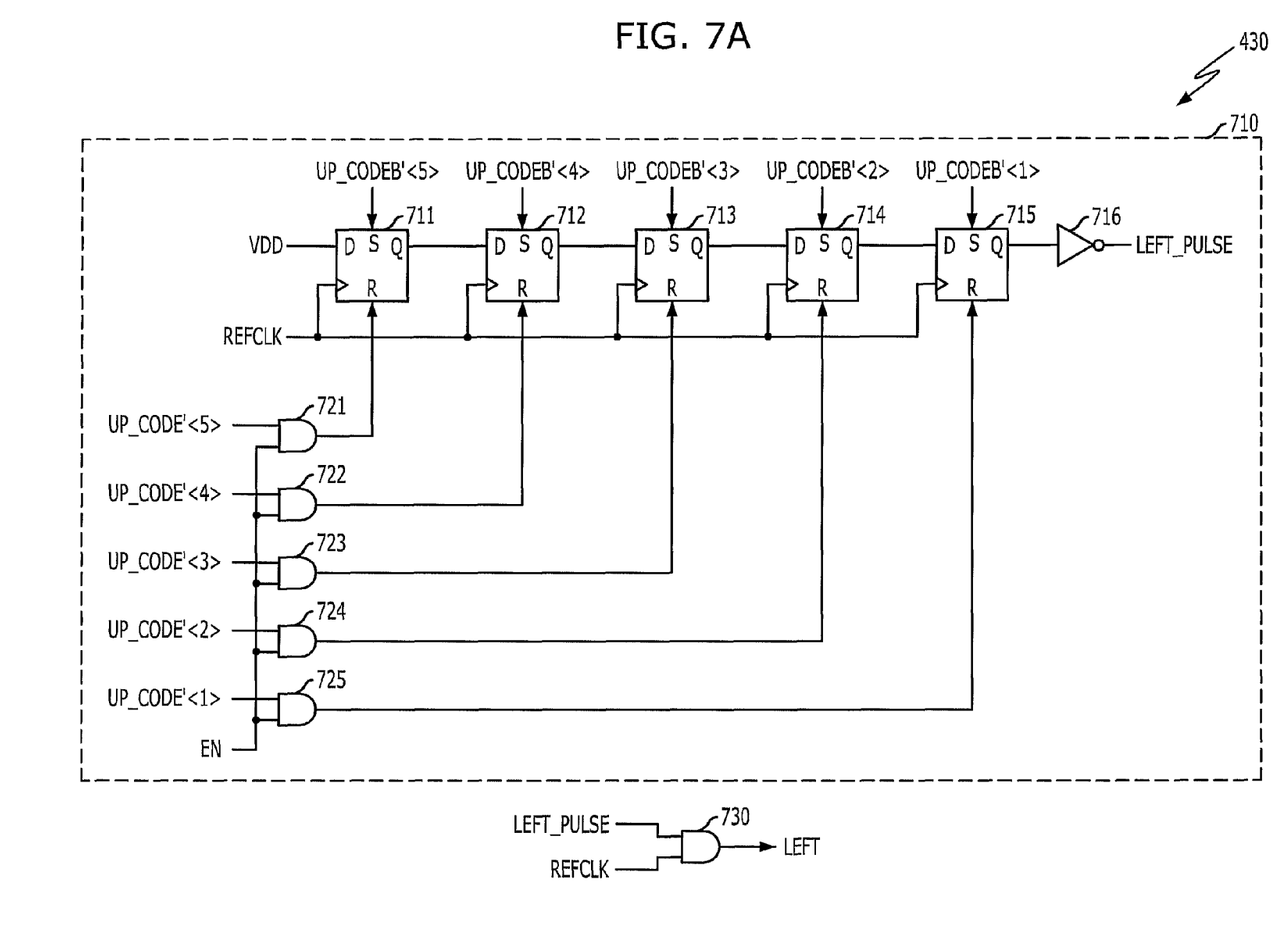
FIG. 7A illustrates a detailed circuit diagram of the left adjustor shown in FIG. 4.
Figure 7B:
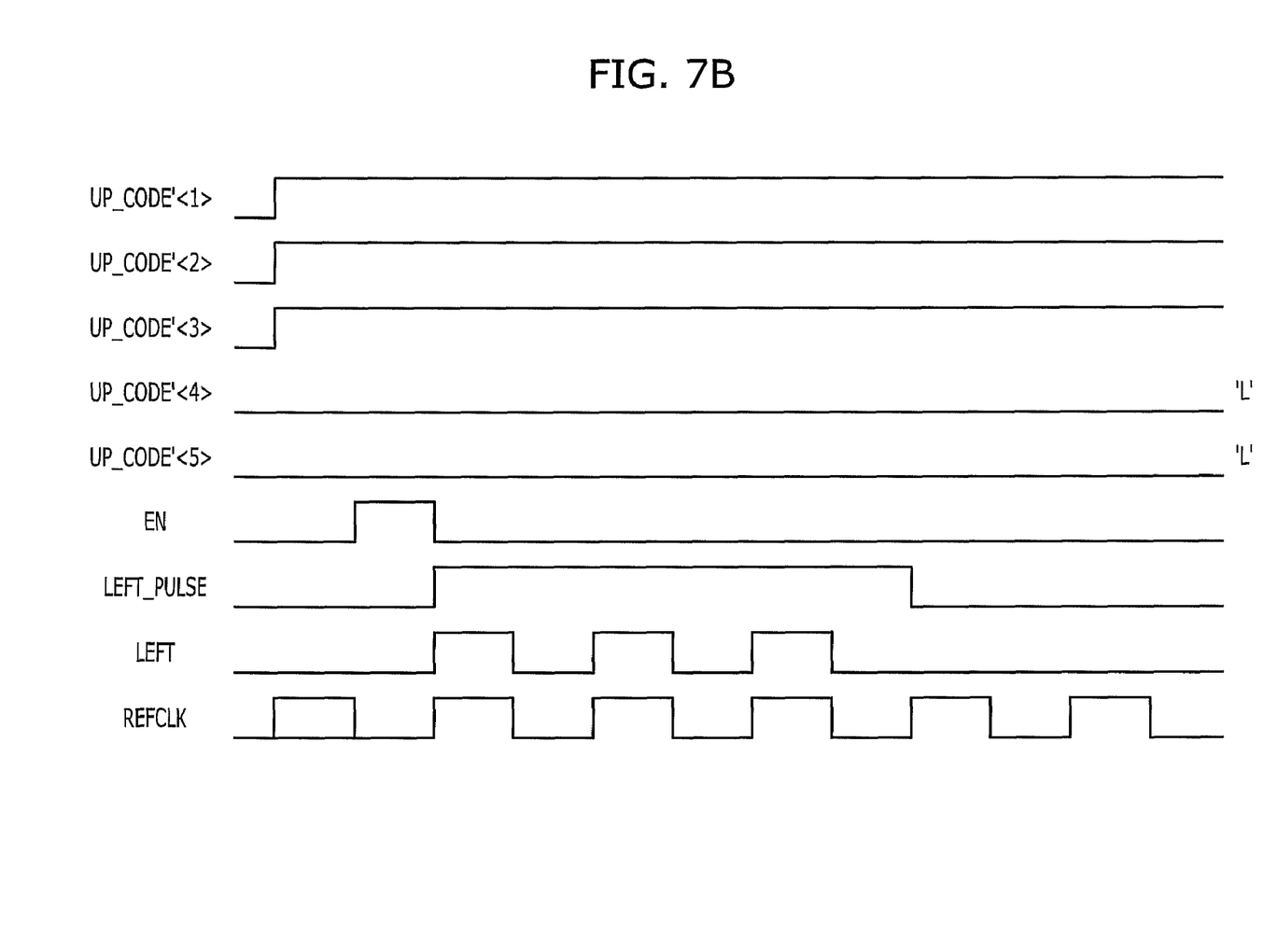
FIG. 7B is a timing diagram for explaining the operation thereof.

FIG. 7A illustrates a detailed circuit diagram of the left adjustor shown in FIG. 4, and FIG. 7B is a timing diagram for explaining the operation thereof.

As shown in FIG. 7A, the left adjustor 430 is provided with a left activation signal generator 710 for generating a left activation signal LEFT_PULSE that is activated during a clock cycle corresponding to the up-code UP_CODE'<1:5>, and a left signal generator 730 for activating a left signal LEFT when the left activation signal LEFT_PULSE and an input clock REFCLK are activated.

To be more specific, the left activation signal generator 710 activates a left activation signal LEFT_PULSE during a clock cycle corresponding to the up-code UP_CODE'<1:5>. As shown in the drawing, the left activation signal generator 710 is composed of D flip-flops 711 to 715, and AND gates 721 to 725. Each of the D flip-flops 711 to 715 has an S terminal as a set terminal that receives an input signal UP_CODEB'<1:5>, and an output terminal Q that outputs '1' unconditionally when the input signal UP_CODEB'<1:5> to the S terminal has a value of '1'. Input to each S terminal is an inverted signal UP_CODEB'<1:5> of the up-code UP_CODE'<1:5>. Also, each of the D flip-flops 711 to 715 has an R terminal as a reset terminal that resets internal signals of the D flip-flops 711 to 715 to '0' when an input signal thereto has a value of '1'. An EN signal inputted to each of the AND gates 721 to 725 is a pulse signal that is activated whenever the left adjustor 430 starts to operate.

The left signal generator 730 activates the left signal LEFT whenever the input clock REFCLK is activated and inputted thereto during the activation of the left activation signal LEFT_PULSE. Therefore, the number of times of activation of the left signal LEFT is determined depending on how wide an activation interval of the left activation signal LEFT_PULSE is. This left signal generator 730 can be composed of an AND gate for receiving a left activation LEFT_PULSE and the input clock REFCLK, as shown in FIG. 7A. Although a clock inputted to the left signal generator 730 is illustrated to be the input clock REFCLK in FIG. 7A, it may be the feedback clock FBCLK, not the input clock REFCLK. In this case, the clock to the clock terminals of the D flip-flops 711 to 715 is also the feedback clock FBCLK, not the input clock REFCLK.

Now, the operation of the left adjustor 430 will be described in detail with reference to FIG. 7B. For illustration purposes, it is assumed that the up-code UP_CODE'<1:5> has (1,1,1,0,0).

The up-code UP_CODE'<4:5> has a value of (0,0), and therefore the up-code UP_CODEB'<4:5> has (1,1). Thus, output bits of the D flip-flops 711 and 712 are unconditionally fixed to be '1'. Similarly, the up-code UP_CODE'<1:3> has (1,1,1), and therefore output bits of the D flip-flops 713 to 715 are all reset to '0' when the EN signal is activated. At this time, an output of the D flip-flop 715 is '0', an output of an inverter 716 becomes '1', and thus the left activation signal LEFT_PULSE is activated. The signals of the D flip-flops 713 to 715 are shifted to the next stages in response to the input clock REFCLK, so that the output of the D flip-flop 715 is changed to '1' after 3 clocks. Hence, the output of the inverter 716 becomes '0' and the left activation signal LEFT_PULSE is deactivated. That is, the left activation signal LEFT_PULSE is activated for 3 clocks.

For an interval where the left activation signal LEFT_PULSE is activated, the left signal LEFT is activated whenever the input clock REFCLK is activated. The left activation signal LEFT_PULSE is activated for 3 clocks, and thus the left signal LEFT is activated three times consecutively.

In Table 1 below, the pulse width of the left activation signal LEFT_PULSE and the number of times of activation of the left signal LEFT are listed depending on code values of the up-code UP_CODE'<1:5>. From Table 1, the operation of the left adjustor 430 can be understood more clearly.

TABLE 1

| <5> | <4> | <3> | <2> | <1> | LEFT_PULSE | LEFT (number of times) |
|-----|-----|-----|-----|-----|------------|------------------------|
| '0' | '0' | '0' | '0' | '0' | 0 * tCK    | 0                      |
| '0' | '0' | '0' | '0' | '1' | 1 * tCK    | 1                      |
| '0' | '0' | '0' | '1' | '1' | 2 * tCK    | 2                      |
| '0' | '0' | '1' | '1' | '1' | 3 * tCK    | 3                      |
| '0' | '1' | '1' | '1' | '1' | 4 * tCK    | 4                      |
| '1' | '1' | '1' | '1' | '1' | 5 * tCK    | 5                      |

Figure 8A:
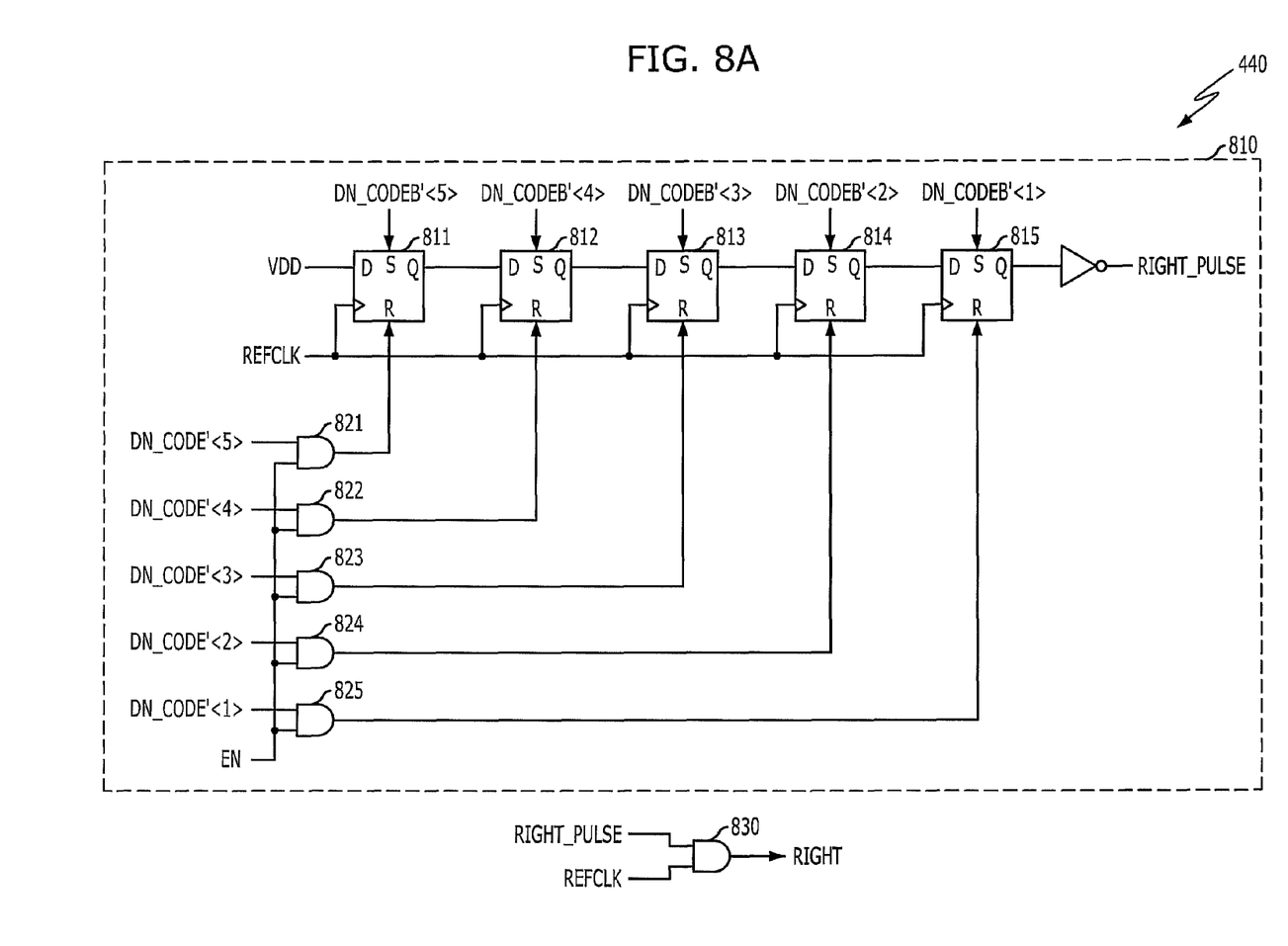
FIG. 8A shows a circuit diagram for explaining the right adjustor shown in FIG. 4.
Figure 8B:
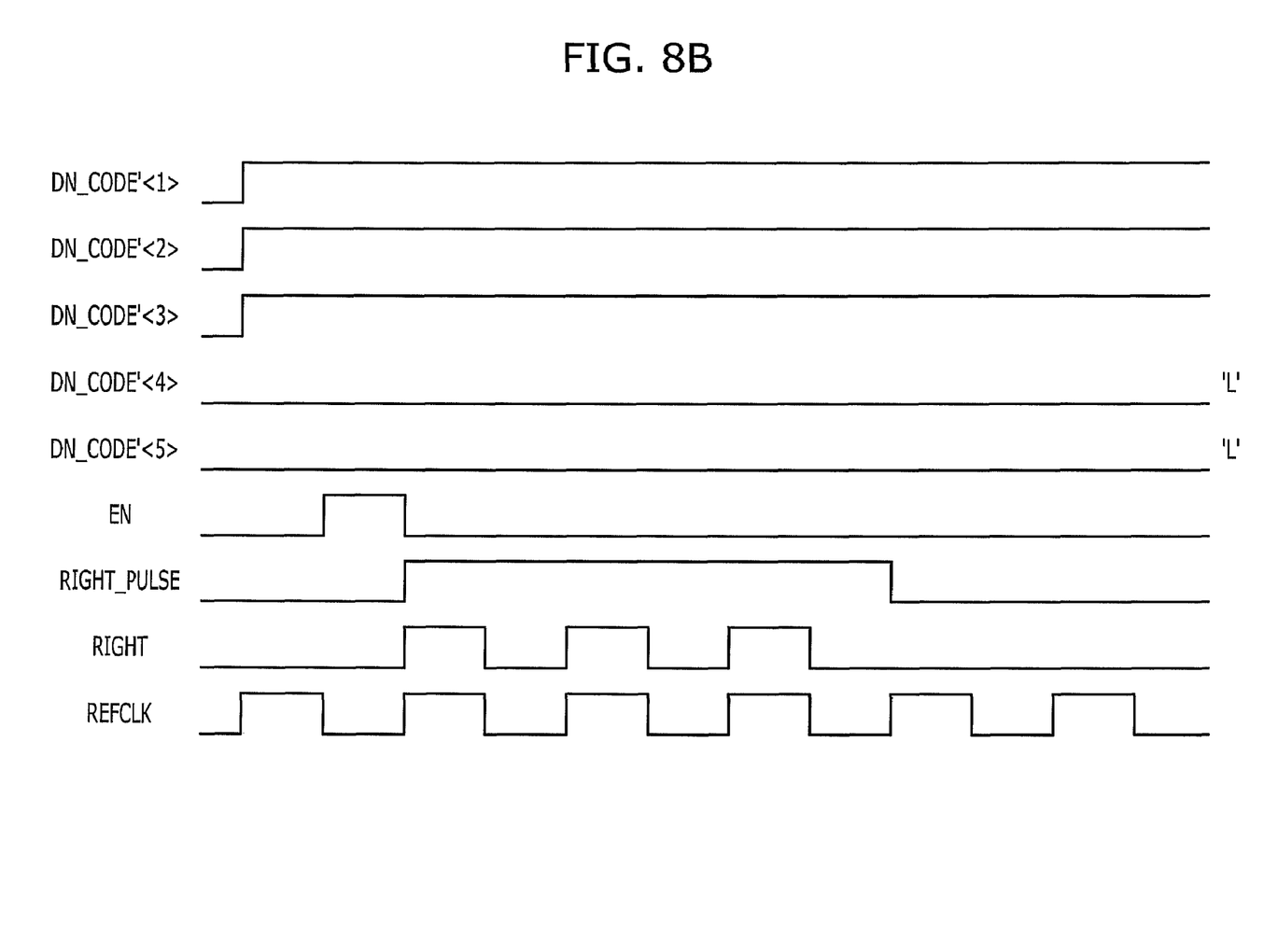
FIG. 8B is a timing diagram for explaining the operation thereof.

FIG. 8A shows a circuit diagram for explaining the right adjustor shown in FIG. 4, and FIG. 8B is a timing diagram for explaining the operation thereof.

As shown in FIG. 8A, the right adjustor 440 is composed of a right activation signal generator 810 for generating a right activation signal RIGHT_PULSE that is activated during a clock cycle corresponding to the down-code DN_CODE'<1:5>, and a right signal generator 830 for activating a right signal RIGHT when the right activation signal RIGHT_PULSE and the input clock REFCLK are activated.

More specifically, the right activation signal generator 810 activates a right activation signal RIGHT_PULSE during a clock cycle corresponding to the down-code DN_CODE'<1:5>. As shown in the drawing, the right activation signal generator 810 can be composed of D flip-flops 811 to 815, and AND gates 821 to 825. Each of the D flip-flops 811 to 815 has an S terminal as a set terminal that receives the input signal DN_CODEB'<1:5>, and an output terminal Q that outputs '1' unconditionally when the input signal DN_CODE'<1:5> to the S terminal has a value of '1'. Input to each 'S' terminal is an inverted signal DN_CODEB'<1:5> of the down-code DN_CODE'<1:5>. Also, each of the D flip-flops 811 to 815 has an R terminal as a reset terminal that resets internal signals of the D flip-flops 811 to 815 to '0' when an input signal thereto has a value of '1'. An EN signal inputted to each of the AND gates 821 to 825 is a pulse signal that is activated whenever the right adjustor 440 starts to operate.

The right signal generator 830 activates the right signal RIGHT whenever the input clock REFCLK is activated and inputted thereto during the activation of the right activation signal RIGHT_PULSE. Therefore, the number of times of activation of the right signal RIGHT is determined depending on how wide an activation interval of the right activation signal RIGHT_PULSE is. This right signal generator 830 can be composed of an AND gate for receiving a right activation signal RIGHT_PULSE and the input clock REFCLK, as shown in FIG. 8A. Although a clock inputted to the right signal generator 830 is illustrated to be the input clock REFCLK in FIG. 8A, it may be the feedback clock FBCLK, not the input clock REFCLK. In this case, the clock to the clock terminals of the D flip-flops 811 to 815 is also the feedback clock FBCLK, not the input clock REFCLK.

The right adjustor 440 has substantially the same configuration as the left adjustor 430 and operates under the same principle. Since the operation of the left adjustor 430 has been already explained, details of the right adjustor 440 will be omitted here.

In Table 2 below, the pulse width of the right activation signal RIGHT_PULSE and the number of times of activation of the right signal RIGHT are listed depending on code values of the down-code DN_CODE'<1:5>. From Table 2, the operation of the right adjustor 440 can be understood more clearly.

TABLE 2

| <5> | <4> | <3> | <2> | <1> | RIGHT_PULSE | RIGHT (number of times) |
|-----|-----|-----|-----|-----|-------------|-------------------------|
| '0' | '0' | '0' | '0' | '0' | 0 * tCK     | 0                       |
| '0' | '0' | '0' | '0' | '1' | 1 * tCK     | 1                       |
| '0' | '0' | '0' | '1' | '1' | 2 * tCK     | 2                       |
| '0' | '0' | '1' | '1' | '1' | 3 * tCK     | 3                       |
| '0' | '1' | '1' | '1' | '1' | 4 * tCK     | 4                       |
| '1' | '1' | '1' | '1' | '1' | 5 * tCK     | 5                       |

Figure 9:
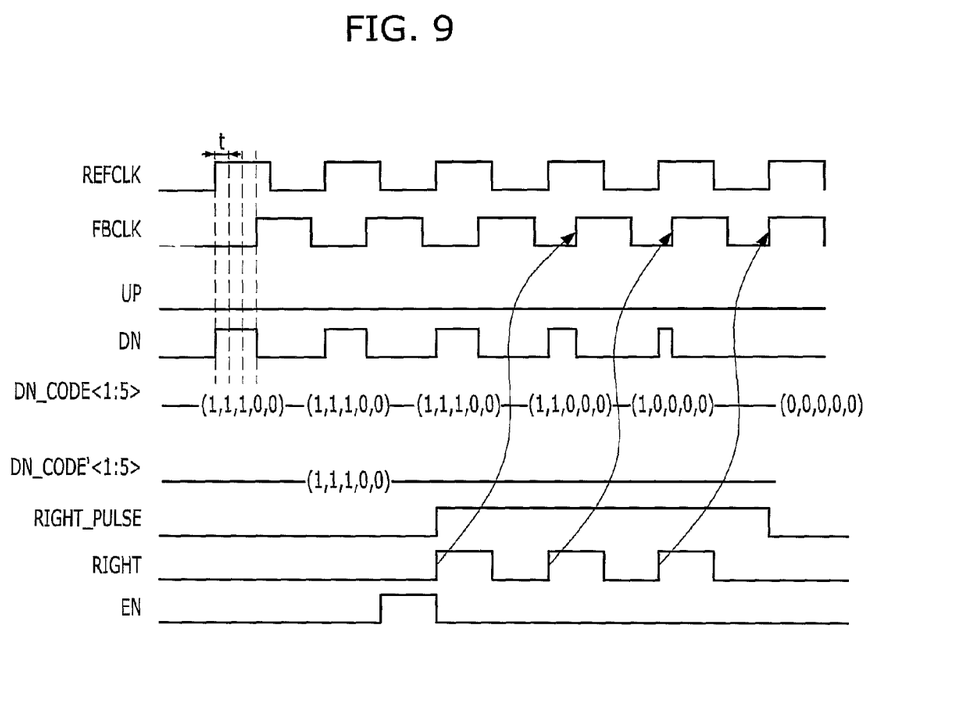
FIG. 9 illustrates a timing diagram for explaining the overall operation of the DLL in accordance with the present invention.

FIG. 9 illustrates a timing diagram for explaining the overall operation of the DLL in accordance with the present invention.

Referring to FIG. 9, it is illustrated that, since a phase of the input clock REFCLK precedes that of the feedback clock FBCLK, the down signal DN is activated with a pulse with of 3 unit delay amount and the up signal UP is deactivated.

When the down signal DN is activated with a pulse with of 3*unit delay amount, the down-code DN_CODE<1:5> is created as (1,1,1,0,0). Then, the created code is filtered by the filter 450 and the filtered down-code DN_CODE'<1:5> is maintained to be the same value for a certain time period although the code value of the down-code DN_CODE<1:5> is varied. In response to the down-code DN_CODE'<1:5>, the right activation signal RIGHT_PULSE is activated for 3 clocks and the right signal RIGHT is activated three times during the activation of the right activation signal RIGHT_PULSE. Whenever the right signal RIGHT is activated once, the delay value of the delay unit 330 is decreased, thereby making the rising edges of the feedback clock FBCLK and the input clock REFCLK consistent with each other.

In this way, since the DLL in accordance with the present invention can control the delay value of the delay unit 330 in several steps even with just one cycle operation, it can considerably improve its operating speed.

Now, a delay locking method in accordance with another embodiment of the present invention will be described in detail with reference to FIGS. 3 to 9.

The delay locking method of the present invention includes: delaying an output clock OUTCLK to output a feedback clock FBCLK; measuring a phase difference between the feedback clock FBCLK and an input clock REFCLK; determining the phase difference in the unit of a unit delay amount; and delaying the input clock REFCLK based on a quantization result to generate the output clock OUTCLK.

In delaying, a delay value is varied by a unit delay value corresponding to the quantization result.

The measuring generates an up signal UP for an interval where a phase of the input clock REFCLK precedes that of the feedback clock FBCLK or a down signal DN for an interval where a phase of the feedback clock FBCLK precedes that of the input clock REFCLK.

The determining includes: determining the up signal UP to generate an up-code UP_CODE<1:5> representing a value of a quantized up signal; determining the down signal DN to generate a down-code DN_CODE<1:5> representing a value of a quantized down signal; activating a right signal RIGHT to decrease a delay value in the delaying for the number of times corresponding to the down-code DN_CODE<1:5>; and activating a left signal LEFT to increase a delay value in the delaying for the number of times corresponding to the up-code UP_CODE<1:5>.

As described above, the DLL in accordance with the present invention does not check simply whether a phase of the input clock precedes that of the feedback clock and vice versa, but measures the degree of precedence between the two clocks. Therefore, the present invention adjusts a delay value of the DLL by an amount corresponding to the measurement result. Accordingly, it is possible to adjust the delay value by N unit delay amount (where N is an integer larger than 1) whenever one cycle operation occurs.

In other words, the conventional DLL performs one cycle one step operation, while the DLL of the present invention enables one cycle multi step operation, thereby considerably improving the operating speed thereof.

While the present invention has been described with respect to the specific embodiments, it will be apparent to those skilled in the art that various changes and modifications may be made without departing from the spirit and scope of the invention as defined in the following claims.

What is claimed is:

1. A Delay Locked Loop (DLL), comprising:
   a replica delay unit configured to delay an output clock to generate a feedback clock;
   a phase detector configured to measure a phase difference between the feedback clock and an input clock and output an up signal or a down signal;
   a quantization unit configured to quantize the phase difference measured by the phase detector; and
   a delay unit configured to delay the input clock based on a quantization result from the quantization unit to generate the output clock,
   wherein the quantization unit comprises:
      an up-code generator configured to quantize the up signal to generate an up-code indicating a value of a quantized up signal;
      a down-code generator configured to quantize the down signal to generate a down-code indicating a value of a quantized down signal;
      a right adjustor configured to activate, for a number of times corresponding to the down-code, a right signal to decrease a delay value of the delay unit; and
      a left adjustor configured to activate, for a number of times corresponding to the up-code, a left signal to increase a delay value of the delay unit.

2. The DLL as recited in claim 1, wherein the quantization unit is configured to quantizes the phase difference measured by the phase detector in units of a unit delay amount, and
   the delay unit is configured to vary a delay value of the input clock by a number of the unit delay amount corresponding to the quantization result from the quantization unit.

3. The DLL as recited in claim 1, wherein the phase detector is configured to outputs the up signal for an interval where a phase of the input clock precedes a phase of the feedback clock or the down signal for an interval where a phase of the feedback clock precedes a phase of the input clock.

4. The DLL as recited in claim 1, wherein the quantization unit further includes:
   a filter configured to filter the up-code generated by the up-code generator and the down-code generated by the down-code generator to transfer filtered codes to the right adjustor and the left adjustor, respectively.

5. The DLL as recited in claim 1, wherein the delay unit includes:
   a plurality of unit delay stages configured to delay the input clock; and
   a shift register configured to adjust the number of the unit delay stages used to delay the input clock in response to the right signal and the left signal.

6. The DLL as recited in claim 1, wherein the up-code generator includes:
   a plurality of unit delay lines of feedback clock configured to sequentially delay the feedback clock by a unit delay amount; and
   a plurality of D flip-flops configured to receive output clocks of the unit delay lines of feedback clock via clock terminals and the up signal via D terminals to generate the up-code.

7. The DLL as recited in claim 6, wherein the down-code generator includes:
   a plurality of unit delay lines of input clock configured to sequentially delay the input clock by a unit delay amount; and
   a plurality of D flip-flops configured to receive output clocks of the unit delay lines of input clock via clock terminals and the down signal via D terminals to generate the down-code.

8. The DLL as recited in claim 1, wherein the left adjustor includes:
   a left activation signal generator configured to generate a left activation signal that is activated during a clock cycle corresponding to the up-code; and
   a left signal generator configured to activate the left signal during the activation of the left activation signal and the clock.

9. The DLL as recited in claim 8, wherein the right adjustor includes:
   a right activation signal generator configured to generate a right activation signal that is activated during a clock cycle corresponding to the down-code; and
   a right signal generator configured to activate the right signal during the activation of the right activation signal and the clock.

10. A delay locking method, comprising:
    delaying an output clock to generate a feedback clock;
    measuring a phase difference between the feedback clock and an input clock to generate an up signal or a down signal;
    quantizing the phase difference in units of a unit delay amount; and
    delaying the input clock based on a result of the quantizing of the phase difference to generate the output clock,
    wherein said quantizing of the phase difference comprises:
       determining the up signal to generate an up-code indicating a value of a quantized up signal;
       determining the down signal to generate a down-code indicating a value of a quantized down signal;
       activating, for a number of times corresponding to the down-code, a right signal to decrease a delay amount in the delaying of the input clock; and
       activating, for a number of times corresponding to the up-code, a left signal to increase a delay amount in the delaying of the input clock.

11. The delay locking method as recited in claim 10, wherein, in the delaying of the input clock, a delay amount is varied by a number of the unit delay amount corresponding to the quantization result.

12. The delay locking method as recited in claim 11, wherein the measuring of the phase difference generates the up signal for an interval where a phase of the input clock precedes a phase of the feedback clock or the down signal for an interval where a phase of the feedback clock precedes a phase of the input clock.

* * * * *